(12) United States Patent
Hsu

(10) Patent No.: US 7,294,792 B2
(45) Date of Patent: Nov. 13, 2007

(54) INSTALLATION AID FOR VERTICALLY MOUNTED COMPONENTS

(75) Inventor: Wen-Hua Hsu, Forest Hills, NY (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/022,237

(22) Filed: Dec. 23, 2004

(65) Prior Publication Data

US 2006/0137908 A1 Jun. 29, 2006

(51) Int. Cl.
*H05K 7/14* (2006.01)
(52) U.S. Cl. .......................... 174/535; 174/54; 174/67; 174/52.1
(58) Field of Classification Search ............... 174/52.1, 174/54, 67, 57, 535
See application file for complete search history.

(56) References Cited

U.S. PATENT DOCUMENTS 5,317,108 A * 5/1994 Prairie, Jr. ................... 174/67
5,944,210 A * 8/1999 Yetter ......................... 220/4.21
6,259,025 B1 * 7/2001 Tai ............................... 174/66

* cited by examiner

*Primary Examiner*—Jinhee Lee
(74) *Attorney, Agent, or Firm*—Scully, Scott, Murphy & Presser, P.C.

(57) ABSTRACT

An apparatus and method providing for ease of installation of a component on a substantially vertical surface. The apparatus, has a back case to be secured to the substantially vertical surface, and a front case securable to the back case, the front case having a raised lip along at least one edge. The back case has a plurality of installation brackets to support the front case by the raised lip. A method of installing a security system component on a substantially vertical surface includes securing a back case to the substantially vertical surface, the back case having a plurality of installation brackets, and supporting a front case in an installation position by the installation brackets. Leads connecting the security system to a component thereof mounted to the front case are secured to the front case, and the front case is secured to the back case in a use position.

12 Claims, 2 Drawing Sheets

INSTALLATION AID FOR VERTICALLY MOUNTED COMPONENTS

BACKGROUND OF THE INVENTION

1. Field of Invention

The invention relates to the field of construction and interior finishing, and more particularly to the field of installation of components vertically mounted, such as on a wall.

2. Description of Related Art

In the installation of a security system, many components are mounted to a wall or other substantially vertical surface. Such components are generally in at least two parts, a back case that is mounted to the surface, and a front case that attaches to the back case. Generally, electronic components that require connection to the remainder of the security system are carried by the front case. Often this connection is via wiring passing through the substantially vertical surface and a corresponding opening in the base.

In order to make the appropriate connections, an installer is required to, at one time, hold the cover and its associated electronic components in an orientation facilitating their connection, the wire lead(s) to be connected to the electronic components, and a tool to accomplish the connection, typically a screwdriver. This is obviously difficult, and time consuming. Therefore, improvements in the installation process are desirable.

BRIEF SUMMARY OF THE INVENTION

In order to overcome these and other disadvantages in the prior art, the present invention provides an apparatus and method providing for ease of installation of a component on a substantially vertical surface. The apparatus, including without limitation a security system component such as a user interface, comprises a back case to be secured to the substantially vertical surface and a front case securable to the back case, the front case having a raised lip along at least one edge. The back case has a plurality of installation brackets to support the front case by the raised lip.

Also provided according to the present invention is a method of installing a security system component on a substantially vertical surface, comprising securing a back case to the substantially vertical surface, the back case comprising a plurality of installation brackets, and supporting a front case in an installation position by the installation brackets. Leads connecting the security system to a component thereof mounted to the front case are secured to the front case, and the front case is secured to the back case in a use position.

BRIEF DESCRIPTION OF THE DRAWINGS

These and other features, advantages, and benefits of the present invention will be made apparent with reference to the following specification and figures, wherein like reference numeral refer to like features across the several views, and wherein.

DETAILED DESCRIPTION OF THE INVENTION

Figure 1:
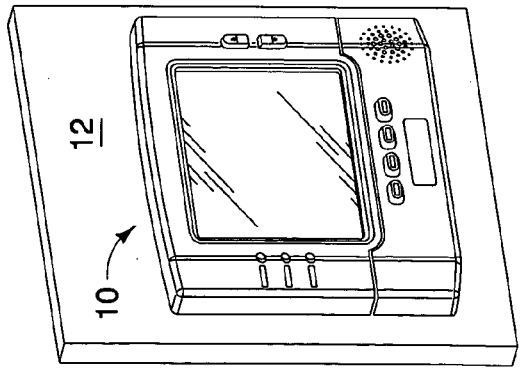
FIG. 1 illustrates a security system component installed on a substantially vertical surface according to an embodiment of the present invention.

Referring now to FIG. 1, shown is a security system component, generally 10, in a use position installed on a surface 12. In this example, the component 10 is an interface panel. The interface panel and similar components 10 can be comprised of at least two parts, a back case 14 and a front case 16. Front case 16 can be secured to back case 14 by a snap fit, as in the illustrated embodiment. Alternately or additionally back case 16 and front case 14 can be securable to one another by a friction fit, snap fit, fasteners, adhesive, or other appropriate means known in the art.

Figure 2:
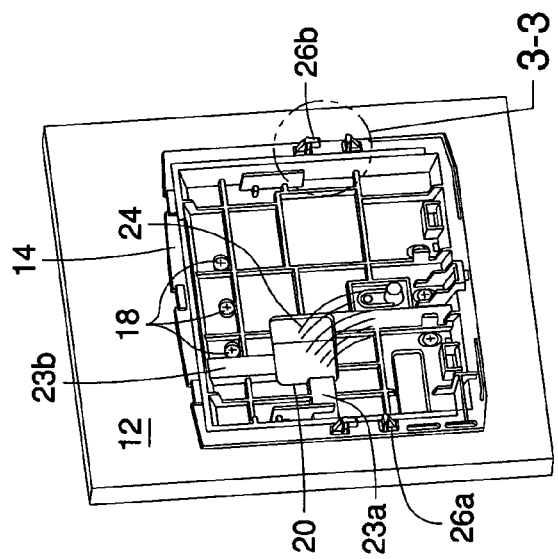
FIG. 2 illustrates a back case of the security system component secured to the substantially vertical surface.

Referring now to FIG. 2, back case 14 has been secured to surface 12, in this case by one or more screw fasteners 18, though other fastener types, adhesives, or solvents may be used in substitution or addition. Back case 14 has a first aperture 20 at least partially co-located with a second aperture 22 in the substantially vertical surface 12, through which lead wires 24 pass. Lead wires 24 may be electrically and/or optically conductive leads, and connect the electrical or electronic elements of the interface panel to the remainder of the security system. Alternately, lead wires 24 may be provided along, rather than through, the substantially vertical surface 12, and may be located within wire guides 23a, 23b, provided on back case 14. Alternately, in the absence of wire channels 23a, 23b, first aperture 20 can be located elsewhere on the component 10, including at a lateral side of the back case 16, to admit the lead wires 24.

Figure 3:
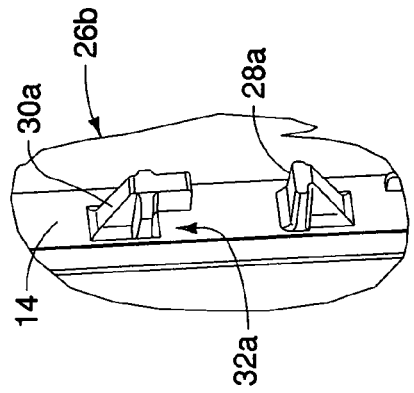
FIG. 3 illustrates a more detailed view of the area enclosed in phantom line circle 3-3 of FIG. 2.

Provided on the back case 14 is a pair of installation brackets 26a, 26b, positioned at laterally separated points on the back case 14. Referring now to FIG. 3, installation brackets 26a (and similarly 26b, with reference to the one being sufficient to describe both) includes a supporting shelf 28a, and a retaining arm 30a. Supporting shelf 28a is upwardly facing, preferably horizontal in the installed position. Alternately or additionally, the supporting shelf 28a may be preferably perpendicular to the back case 14. Retaining arm 30a extends outwardly from the back case 14, and downwardly towards supporting shelf 28a forming a retaining space 32a. Alternately, the retaining arm may extend laterally to form the retaining space 32a above the supporting shelf 28a.

Figure 5:
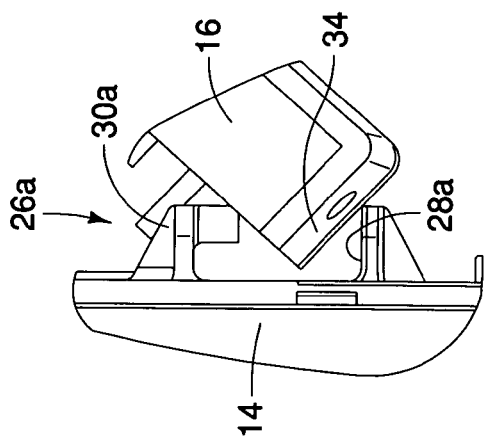
FIG. 5 illustrates a more detailed view of the area enclosed in phantom line circle 5-5 of FIG. 4.
Figure 4:
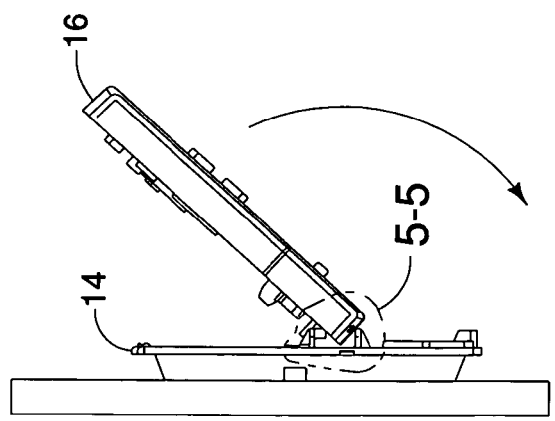
FIG. 4 illustrates the system component of FIG. 1 in an intermediate step of a mounting process according to the present invention.

Referring now to FIG. 4, illustrated in side view are the back case 14 and front case 16, in the process of being mounted as an intermediate step in performing an installation. As shown in greater detail in FIG. 5, front case 16 has a raised lip 34 along at least one edge thereof, typically at least a lower edge. In the illustrated embodiment, the raised lip 34 extends around the entire periphery of the front case 16. This would, of course, interfere with the alternate lateral configuration of the installation brackets 26a, 26b, as described above. Those skilled in the art will appreciate that the raised lip 34 and the installation brackets 26a, 26b, shall be configured to cooperate in use.

To mount for installation, the front case 16 is inserted into installation bracket 26a (and similarly corresponding bracket 26b, reference to the one being sufficient to describe both). Raised lip 34 is inserted into the retaining space 32a, beneath the retaining arm 30a. The front case 16 is pivoted to approximately horizontal position, and rested on supporting shelf 28a.

Figure 6:
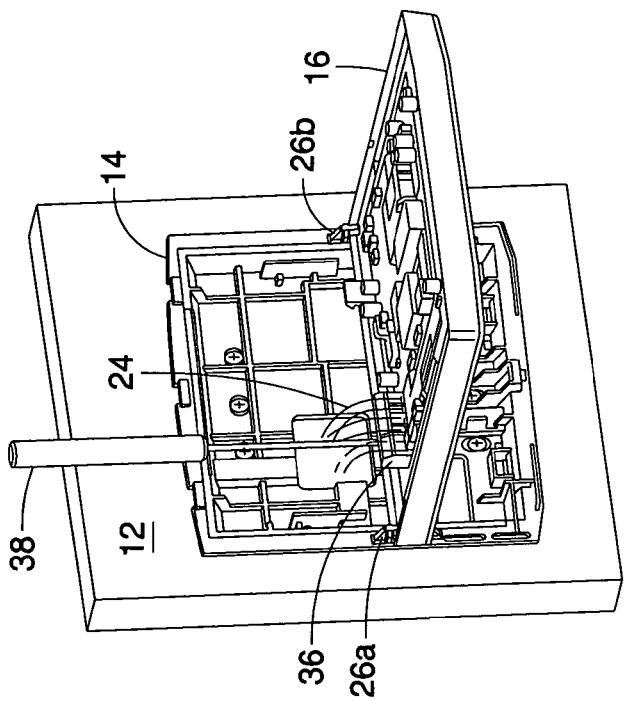
FIG. 6 illustrates a further intermediate step of an installation process according to the present invention.

Referring now to FIG. 6, the frost case 16 is shown supported by installation brackets 26a, 26b. Thus supported, the technician's hands are free to manipulate lead wires 24, and locate them as necessary in terminal block 36, where they are secured with screwdriver 38. It will be apparent to those skilled in the art clear that the invention is equally useful regardless of the method of attaching wire leads 24 to the front case 16. With the leads 24 secured to the terminal block 36, the front case 16 may be removed from the installation brackets 26a, 26b, and secured to the back case 14 in a use position.

The present invention has been described herein with reference to certain embodiments. These embodiments are meant to be illustrative, and not limiting, on the scope of the present invention, which scope is defined solely with reference to the appended claims.

The invention claimed is:

1. An apparatus adapted for ease of installation on a substantially vertical surface, the apparatus comprising:
   a back case to be secured to the substantially vertical surface;
   a front case securable to the back case in a first installed position, the front case having a raised lip along at least one edge;
   a plurality of installation brackets carried by the back case, the installation brackets each comprising a supporting shelf and a retaining arm, the retaining arm at least partially defining a retaining space above the supporting shelf;
   wherein, the raised lip is insertable into the retaining space to sit on the supporting shelf and pivotably engage the retaining arm, the front case being pivotable around the raised lip from the first installed position to a second installation position forming an angle with the first installed position and being supported in the second installation position through the engagement between the installation brackets and the raised lip.

2. The apparatus according to claim 1, wherein the supporting shelf is oriented substantially perpendicular to the back case.

3. The apparatus according to claim 2, wherein the supporting shelf is substantially horizontal when the back case is mounted to the substantially vertical surface.

4. The apparatus according to claim 1, wherein the retaining arm is secured to the back case above the retaining space, and extends downward to at least partially define the retaining space.

5. The apparatus according to claim 4, wherein the raised lip extends around the periphery of the front case.

6. The apparatus according to claim 1, wherein the retaining arm is secured to the back case adjacent the retaining space, and extends laterally to at least partially define the retaining space.

7. The apparatus according to claim 1, wherein the second installation position is a substantially horizontal position.

8. The apparatus according to claim 1, wherein the front case is securable to the back case by one or more of group comprising a friction fit, snap fit, fasteners and an adhesive.

9. The apparatus according to claim 1, further comprising a first aperture in the back case at least partially co-located with a second aperture in the substantially vertical surface.

10. The apparatus according to claim 9, wherein the installation brackets are positioned beneath the first aperture.

11. The apparatus according to claim 1, further comprising a user interface to a security system.

12. The apparatus according to claim 10, wherein the user interface is carried by the front case.

* * * * *